United States Patent [19]

Gifft

[11] Patent Number: 4,529,967
[45] Date of Patent: Jul. 16, 1985

[54] NON CONTACTING INDUCTIVE KEYBOARD

[76] Inventor: Thomas H. Gifft, 1500 E. Concord Ave., Orange, Calif. 92667

[21] Appl. No.: 398,704

[22] Filed: Jul. 15, 1982

[51] Int. Cl.³ .............................................. G08C 9/00
[52] U.S. Cl. ........................... 340/365 L; 340/365 E; 340/365 S; 178/17 C; 400/479.2
[58] Field of Search ............... 340/365, 365 L, 365 C, 340/365 S, 365 R; 178/17 C; 179/90 K; 364/900; 400/479.2

[56] References Cited

U.S. PATENT DOCUMENTS

| | | | |
|---|---|---|---|
| 3,363,737 | 1/1968 | Wada | 340/365 L |
| 3,740,746 | 6/1973 | Dureau | 340/365 L |
| 3,750,149 | 7/1973 | Sessler | 340/365 C |
| 3,848,252 | 11/1974 | Chang | 340/365 L |
| 3,921,167 | 11/1975 | Fox | 340/365 C |
| 3,951,250 | 4/1976 | Pointon | 340/365 C |
| 4,145,748 | 3/1979 | Eichelberger | 340/365 C |
| 4,257,117 | 3/1981 | Besson | 340/365 C |
| 4,277,780 | 7/1981 | Sonderman | 340/365 S |
| 4,300,127 | 11/1981 | Bernin | 340/365 L |
| 4,305,135 | 12/1981 | Dahl | 340/365 S |
| 4,494,109 | 1/1985 | Bernin | 340/365 L |

Primary Examiner—John W. Caldwell, Sr.
Assistant Examiner—Michael F. Heim
Attorney, Agent, or Firm—Charles H. Schwartz; Ellsworth R. Roston

[57] ABSTRACT

An inductive keyboard, including, printed circuit patterns forming a multiplicity of key excitation patterns and key sensing patterns. The key excitation patterns are divided into groups of excitation patterns formed in rows. The key sensing patterns are divided into groups of sensing patterns formed in columns. Each key excitation pattern has an adjacent complementary key sensing pattern for providing output signals from the sensing patterns in different columns by passing an excitation signal through an individual row of excitation patterns. At least one movable element is located adjacent each pair of complementary key excitation and sensing patterns. The movement of each movable element is between positions close to and away from each pair of complementary patterns to provide for a change in the output signal from the individual key sensing patterns. Printed circuit reference patterns form at least one excitation reference pattern and one sensing reference pattern. The excitation reference pattern are coupled to the excitation key patterns to have the excitation signal pass through the reference excitation pattern for providing at least one reference signal from the sensing reference pattern. One or more comparators provide a comparison between the reference signal and the output signals to provide a comparison of the modulated mutual inductance of the key patterns with the mutual inductance of the reference patterns independently of the excitation current.

28 Claims, 6 Drawing Figures

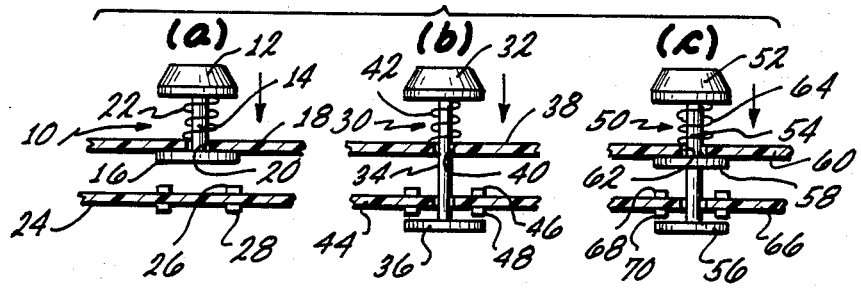
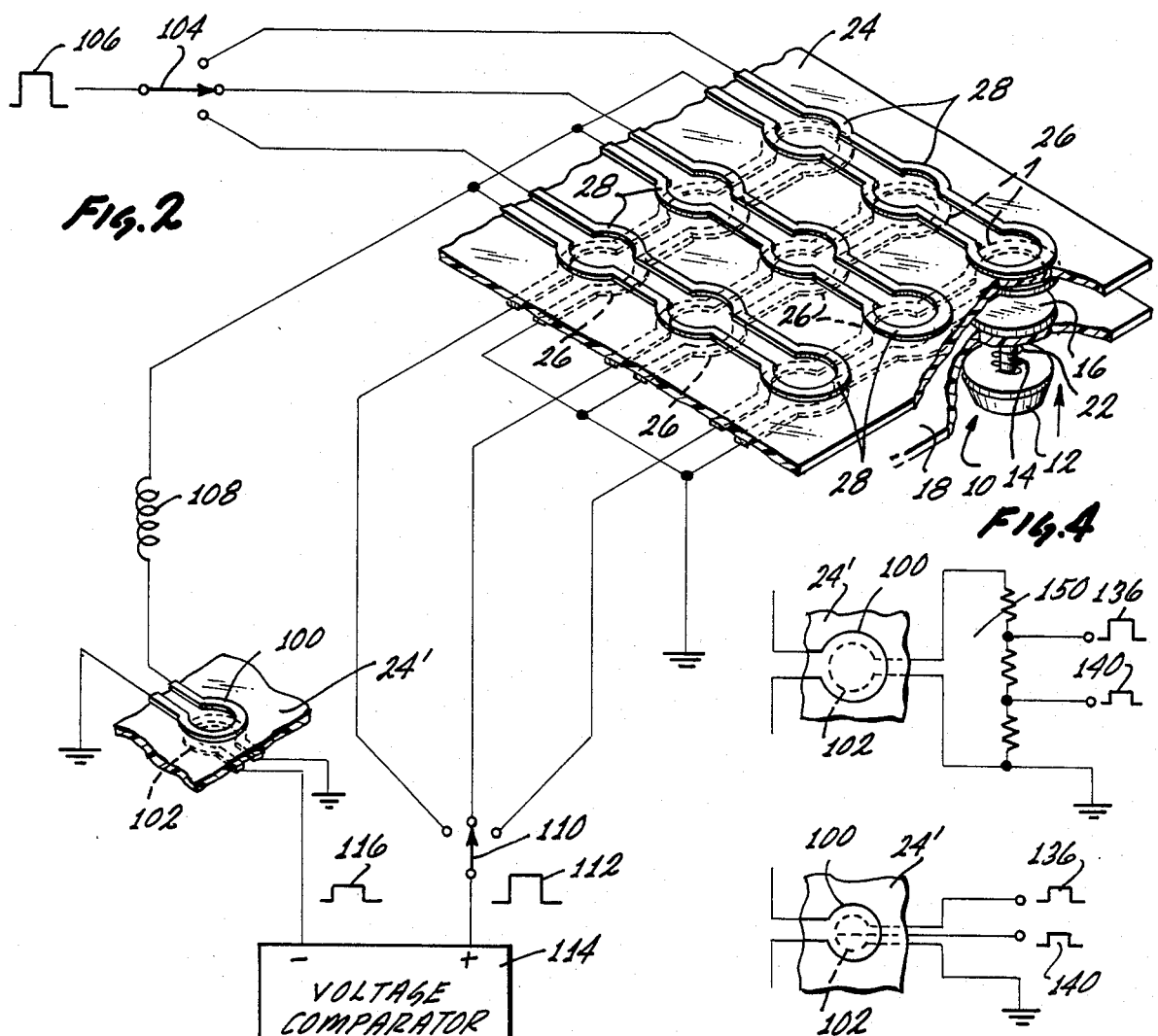
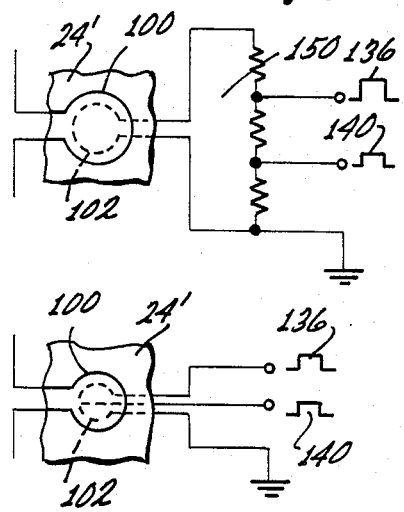

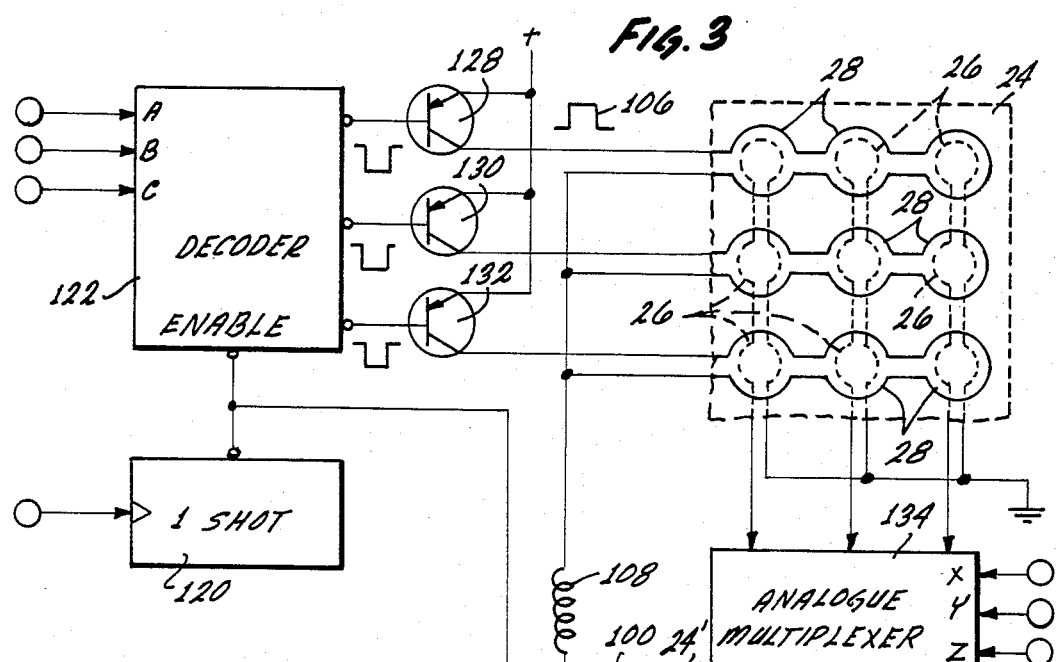
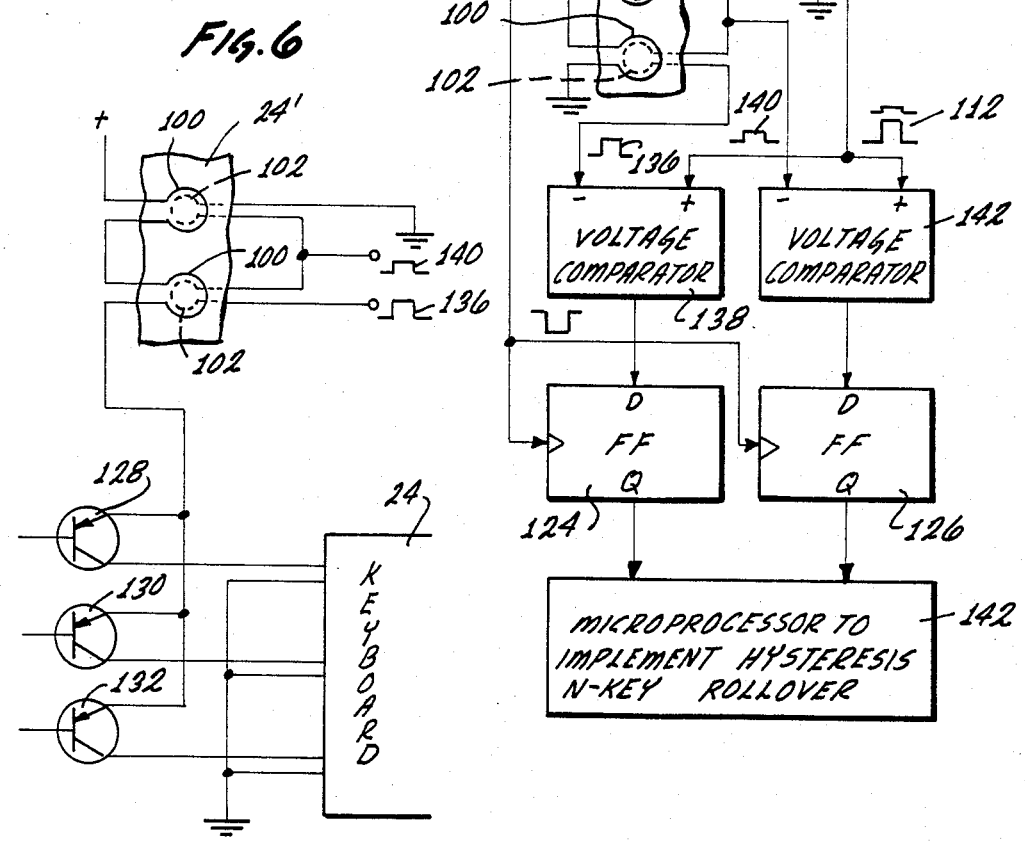

NON CONTACTING INDUCTIVE KEYBOARD

BACKGROUND OF THE INVENTION

1. Field of the Invention

The present invention relates to a non contacting magnetic keyboard having a simple printed circuit construction and with a minimum of network elements.

2. Description of the Prior Art

Keyboards are typically used in a variety of devices including computers, computer terminals, calculators, control panels, telephone devices, etc. The prior art keyboards are generally two types. The older types of keyboards are mechanical and include electrical contacts. More recently keyboards have been designed which may be referred to as solid state non contacting types. It will be appreciated that the mechanical types of keyboards suffer from mechanical wear, erosion and corrosion of contacts, etc. which limit their useful life and reliability. The solid state types of keyboards include; electro magnetic, capacitive, photo electric, hall effect types, etc. Although the solid state types represent an improvement over the mechanical types, most of the solid state types suffer from high cost while still exhibiting problems with performance and reliability. Therefore, there have been numerous attempts to provide improved non-contacting keyboards to eliminate the above problems.

As an example, Cochran et al. U.S. Pat. No. 3,668,697, Holz U.S. Pat. No. 3,683,361 and Bernin U.S. Pat. No. 4,300,127 all include the use of a printed circuit board with printed circuit elements forming excitation and sensing elements in a network and with a movable element controlling the passage of a signal from the excitation to the sensing elements. Additionally, the Bernin et al. U.S. Pat. No. 3,918,051 discloses a non-contacting keyboard using a balanced drive wire system. The Cochran et al. and Bernin U.S. Pat. No. 4,300,127 both use a balanced system and incorporate a separate balance or bucking coil arrangement for each actuating position. The Bernin et al. U.S. Pat. No. 3,918,051 has a complicated system in using two additional common wires additionally to the excitation and sensing wires. The Holz patent does not include any balancing to improve the keyboard performance. However, as will be seen, these prior art devices do not incorporate the advantages of the present invention.

SUMMARY OF THE INVENTION

A two dimensional keyboard is arranged into rows and columns to form a matrix and as a specific example each row may form a plurality of key excitation patterns and with each pattern in an individual row connected in series so that one whole row of patterns may be excited at the same time. Each column may similarly form a plurality of key sensing patterns and with each pattern in an individual column connected in series so that one whole column of patterns at a time may be sensed. By exciting one row and sensing one column a single particular key can be addressed so as to determine whether there has been an actuation of the key at that particular key position. This structure allows for the sequential exciting of different rows and with the sequential sensing of different columns so that the depression of each key can be individually determined independently of the depression of other keys. The structure thereby allows for the use of the N-Key Rollover technique so that the depression of a plurality of keys may be sensed.

The multiplicity of key excitation and sensing circuit patterns may be on the same side of the etched printed circuit board or the multiplicity of key excitation and sensing patterns may be on the opposite sides of the etched printed circuit board. The particular examples of the invention shown in this application use the key excitation and sensing circuit patterns on opposite sides of the etched printed circuit board.

In general, each key actuation is read in the following fashion: A varying voltage such as a square wave is applied to a particular row of key excitation patterns to thereby produce a varying current through this particular row. This excitation current causes a varying magnetic field to be created in the vicinity of each pattern within the particular row. The varying magnetic field then induces a voltage to be produced in the complementary sensing patterns which are part of a number of different columns of sensing patterns. The amplitude of the induced voltage is a function of the mutual inductance between the key patterns and the rate of change of the excitation current. The excitation current in turn is a function of the series inductance and the mutual inductance in the excitation circuit.

Adjacent each key excitation pattern and sensing pattern is a key structure and with the depression of the key altering the voltage induced to the complementary sensing patterns, by an alteration of the mutual and series inductances. For example, the depression of the key may provide for either a conductive or magnetically susceptible material to be moved relative to the magnetic field created around each key excitation pattern in the row. The alteration of the induced voltage thereby provides for a change in the amplitude of the induced voltage which in turn is a measure of the amount of key depression.

The conductive or magnetically susceptible material may be formed as a disk and the sensed voltage may be either caused to increase or decrease upon depression of the key. The increase or decrease of the voltage is dependent upon a number of factors including the type of material or combinations of materials and whether the material is moved closer to or away from the patterns upon depression of the key.

The induced voltage by itself is not an accurate measure of the amount of key depression since the induced voltage by itself is subject to a number of variables other than key depression. For example, in a matrix system the induced voltage will be a function of the number of key stations in each row as well as the number of keys depressed in each row. Both of the above will effect the series inductance and mutual inductance in the excitation circuit. In addition, the induced voltage is a function of the amplitude of the input voltage such as the square wave. However, the change in mutual inductance at any individual key station is a accurate measure of key depression since the change in mutual inductance at a key station is independant of the variables described above. The present invention provides for an apparatus and method for cancelling out the variables described above to provide for voltage measurements which when compared reflect individual mutual inductances and hence key depression.

The present invention contemplates the use of the above described key structure in combination with a common reference circuit which may include excitation and reference sensing patterns. In particular, all of the rows of key excitation patterns are arranged to be in series with the common reference circuit such as at least one reference excitation pattern so that all of the excitation patterns and the reference patterns would receive the same excitation current. This reference excitation pattern has a complementary reference sensing pattern and with the induced voltage in the reference sensing pattern used to provide for a reference signal for comparison with any of the individual output signals produced from the individual key sensing patterns. It should be appreciated that the reference circuit may be provided by an inductance other than a printed circuit pattern such as a conventional inductor, a lumped coil, a wire loop etc. and with the reference signal produced across this inductance. However, the reference pattern structure would preferably be provided on the printed circuit board in the same manner as the excitation and sensing patterns so as to provide for stability since such an arrangement would automatically compensate for any changes which would effect the reference signal equally with the output signals from the sensing patterns. The reference patterns may also be used to provide for more than one reference voltage so that both partial and full key depressions may be sensed to provide for key height hysteresis to overcome false key repeats.

Since the reference circuit is in series with each of the rows of key excitation patterns, the reference circuit receives the same excitation current as the key excitation and sensing patterns. Therefore, the variables described above will effect the reference signal to the same degree as the output signals at any key station. However, the ratio of the amplitudes of the output signals and the reference signal will be the same as the ratio of the mutual inductance of any of the individual pair of key patterns and the reference patterns. In this way, a comparison of the amplitudes of any of the output signals and the reference signal is a comparison of the mutual inductances which is an accurate measure of key depression of a selected key regardless of the position of other keys, the number of key stations in the selected row or the amplitude of the excitation voltage.

The solid state non-contacting keyboard of the present invention may thereby provide for a simple and a reliable keyboard which may be characterized as non electrical since there are no individual electrical connections of the key assemblies to the printed circuit board. Additionally there is no need for electrical components within each key scan area except for the etched key excitation and sensing patterns. Each key station only includes one or more disk like elements to alter the voltage induced in the key sensing patterns. The only mechanical structures necessary, in addition to the disk like elements are a key cap, a plunger to support the disk like element, and a plunger bearing.

Other advantages of the present invention is the use of printed circuit low impedance circuit paths so as to minimize electrical static discharge susceptibility and electromagnetic interference susceptibility. In addition, key height hysteresis may be easily incorporated so as to eliminate false key repeats and also the keyboard may be adapted to incorporate N-Key Rollover. The measurement times for each individual position may be short, thereby allowing for high keyboard scan rates. The present invention may also have a high reliability because of the simplified structure of the keyboard and accompanying circuitry and additionally all of this accomplished at a relatively low cost.

BRIEF DESCRIPTION OF THE DRAWINGS

A clearer understanding of the invention will be had with reference to the following description and drawing wherein;

FIGS. 1 (a), 1(b) and 1(c) illustrate three alternate arrangements for each key station;

FIG. 2 illustrates a printed circuit board incorporating a multiplicity of key excitation and sensing patterns and including common reference patterns and additionally including the associated circuitry for the excitation and sensing of individual key stations;

FIG. 3 illustrates a system for automatically scanning and sensing all of the individual key stations for the keyboard so as to sense each individual key depression and thereby provide output signals in acordance with the sensed key depression as compared to a reference circuit producing a plurality of reference signals;

FIG. 4 illustrates another embodiment for the reference circuit for providing a plurality of reference signals;

FIG. 5 illustrates a further embodiment for the reference circuit for providing a plurality of reference signals; and FIG. 6 illustrates an alternative circuit location for the reference circuit of FIG. 3.

DESCRIPTION OF THE PREFERRED EMBODIMENTS

FIGS. 1(a), 1(b) and 1(c) illustrate three alternative key station structures in accordance with the present invention with FIG. 1(a) being the preferred embodiment. In FIG. 1(a) a particular key station includes a key 10 having a key cap 12 mounted at one end of a plunger 14 and with a disk member 16 mounted at the other end of the plunger 14. The key 10 is supported for actuation on a plate 18 and with an opening 20 in the plate 18 representing a plunger bearing. A spring member 22 biases the key 10 in the upward direction. It is to be appreciated that a plurality of such key members may be mounted on the plate 18.

A printed circuit board 24 is mounted adjacent the plate 18 and includes key excitation and sensing patterns located on opposite sides of the board 24. In particular, one side of the board 24 includes a first key pattern 26 and the opposite side of the board includes a second key pattern 28. The disk member 16 may be either a conductive disk or a magnetically susceptible disk. For example, as shown in FIG. 1(a), if the disk 16 is a conductive disk then as the key 10 is depressed so that the disk is moved closer to the circuit patterns 26 and 28, this causes a decrease in the voltage produced across the sensing pattern. If the disk 16 is a magnetically susceptible disk then as the key 10 is depressed so that the disk is moved closer to the circuit patterns 26 and 28, this causes an increase in the voltage produced across the key sensing pattern. In the preferred embodiment of the invention the pattern 28 is the key excitation pattern and the pattern 26 is the key sensing pattern and with the disk 16 being a conductive disk. With this structure, as the key 10 is depressed, the voltage produced across the key sensing pattern 26 is decreased. It is preferable to have the disk 16 adjacent the key sensing pattern to minimize loading the input excitation source especially if there is a multi key depression.

FIG. 1(b) illustrates a first alternative key station structure including a key 30 having a key pad 32 at one end of a plunger 34 and with a disk member 36 at the other end of the plunger 34. The key 30 is supported by a plate 38 and with the opening 40 in the plate, 38 representing the plunger bearing. The spring 42 provides a bias of the key 30 in the upward direction.

A printed circuit board 44 includes a first key circuit pattern 46 on one side of the board and a second key circuit pattern 48 on the other side of the board. With the structure of FIG. 1(b), the depression of the key 30 provides for the disk 36 to be moved away from the circuit patterns 46 and 48.

If the disk 36 is a conductive disk then the depression of the key causes an increase in the voltage produced across the key sensing pattern. If the disk 36 is a magnetically susceptible disk then a depression of the key causes a decrease in the voltage produced across the key sensing pattern. As with the structure of FIG. 1(a) it is preferable to have the pattern adjacent the disk 36 be the key sensing pattern to minimize loading the key excitation source such as with a multi key depression. Therefore, in the structure of FIG. 1(b) the pattern 46 would form the key excitation pattern and the pattern 48 would form the key sensing pattern.

FIG. 1(c) illustrates a second alternative key station structure. In FIG. 1(c) a key 50 includes a key pad 52 mounted at one end of a plunger 54. A first disk member 56 is mounted at the other end of the plunger 54 and with a second disk member 58 mounted at an intermediate position on the plunger 54. The key 50 is supported by a plate 60 and with the opening 62 representing the plunger bearing and with a spring member 64 providing for a bias of the key 50 in the upward direction. A printed circuit board 66 includes a first key circuit pattern 68 on one side of the board and a second key circuit pattern 70 on the other side of the board.

The embodiment of FIG. 1(c) may be used to provide for an even greater increase or decrease of the voltage produced across the key sensing pattern. This is accomplished by having one of the disks 56 and 58 being conductive while the other is a magnetic susceptible disk. For example, if the disk 58 is the conductive disk and the disk 56 is a magnetically susceptible disk then as the key 50 is depressed the disk 58 moves closer to the circuit patterns while the disk 56 moves away from the circuit patterns, thereby causing a greater reduction in the voltage produced across the key sensing pattern than would be possible with the key station structures shown in FIGS. 1(a) and 1(b).

Alternately, the disk 56 may be the conductive disk and the disk 58 may be the magnetically susceptible disk so that as the key is depressed this causes the conductive disk to be moved away from the circuit patterns while the magnetically susceptible disk is moved closer to the circuit patterns thereby causing a greater increase in the voltage produced across the key sensing patterns than would be possible with the key station structures of FIGS. 1(a) and 1(b). If the disk 56 is the conductive disk then it would be preferable to have the circuit pattern 70 being the key sensing pattern as explained above. Alternately, if the disk 58 is the conductive disk then it would be preferable to have the circuit pattern 68 be the key sensing pattern. It can be seen therefore that various key station structures may be used either causing an increase or decrease in the voltage produced across the key sensing pattern in accordance with a key depression.

It will be appreciated that although the key station structures have been shown with printed circuit patterns on opposite sides of the printed circuit board, the circuit patterns could be located on the same side of the board. However, for purposes of uniformity the remaining portions of the specification will be described with reference to the preferred embodiment of FIG. 1(a) wherein the key excitation and sensing pattern of 28 and 26 are on opposite sides of the printed circuit board 24. It can also be seen that in the embodiment of FIG. 1(a) no drilled holes or through hole plating is required in the individual key scan areas. The disk 16 is preferably a conductive disk which is moved closer to the key sensing pattern 26 as the key 10 is depressed. This changes the voltage produced across the key sensing pattern 26 from a full amplitude to an amplitude near zero with minimal modulation of the excitation current even when many keys are depressed simultaneously.

In the preferred embodiment, a square voltage pulse is applied to the key excitation patterns. The key excitation patterns form almost a perfect inductance so that the excitation current has a constant rate of change which rises linearly in accordance with the excitation voltage. The excitation current then produces a magnetic field having a constant rate of change which in turn induces a square voltage pulse across the key sensing pattern. The output sensed pulse is thereby similar to the input excitation pulse.

FIG. 2 illustrates a keyboard arrangement using a plurality of individual key stations and in particular shows the printed circuit board 24 having on opposite sides the multiplicity of key excitation patterns 28 and key sensing patterns 26 arranged in rows and columns. The individual keys 10 are constructed as illustrated in FIGS. 1(a) and a multiplicity of the individual keys would be positioned at the positions corresponding to each pair of complementary patterns 26 and 28. It is to be appreciated that the key stations may also be constructed in accordance with the teachings shown in FIGS. 1(b) and 1(c) and that the structure shown is illustrative only.

In addition to the multiplicity of key excitation patterns 28 and key sensing patterns 26, a reference circuit formed by reference patterns are provided on a printed circuit board 24'. The board 24' may either be formed as a part of the board 24 or may be a separate board having substantially the same characteristics as the board 24. Also, as indicated above, the reference circuit may be formed by a conventional inductor of any form and with the reference signal produced across this inductor. However, in the preferred embodiments the board 24' includes an excitation reference pattern 100 on one side of the board 24' and a sensing reference pattern 102 on the opposite side of the board 24' in a substantially identical manner to the key excitation and sensing patterns 28 and 26. The reference patterns 100 and 102 may be smaller in size than the key patterns 28 and 26 so that the reference signal produced across the sensing reference pattern will have a smaller amplitude than the amplitude of the output signals produced across the key sensing patterns 26.

The key excitation patterns 28 are shown to be the arranged in rows and with each row including a plurality of key excitation patterns arranged in series. Each row of key excitation patterns 28 is in turn arranged to be in series with the excitation reference pattern 100. Specifically as shown in FIG. 2, a switching member 104 is shown to receive a square wave signal as represented by voltage pulses 106. The switching member 104 is controlled to sequentially switch voltage pulses 106 to the rows of key excitation patterns 28. Each row thereby receives the excitation pulses 106 in sequence and with the excitation reference pattern 100 common to all of the rows of key excitation patterns 28 also receiving the excitation pulses. The reference circuit may also include a fixed inductor 108 to shape the current pulses flowing in the excitation circuit.

As the excitation pulses 106 are sequentially used to excite all of the rows of key excitation patterns 28, the columns of key sensing patterns 26 may be sequentially scanned using a scanning switch 110 so as to sense the output signals from the sensing patterns 26.

All of the key sensing patterns in each column are arranged in series. By the structure shown in FIG. 2, each row of key excitation patterns can be individually excited and similarly each column of key sensing patterns can be individually sensed. Therefore, by exciting the rows sequentially and sensing the columns sequentially all of the individual keys can be addressed to determine the individual keys which have been depressed. Moreover, since each individual key can be addressed to determine the depression of the key independently of the depression of other keys, the system will correctly respond to the depression of a plurality of keys at slightly different times.

The output pulses produced across the key sensing patterns 26 are shown by pulses 112. The amplitude of the output pulses 112 representing individual key stations are in accordance with the individual key depressions. The output pulses 112 are applied to a voltage comparator 114 as a first input. A second input to the voltage comparator 114 is an output pulse produced from the reference circuit and specifically is a reference pulse 116 produced across the sensing pattern 102 formed on the board 24′. The reference circuit therefore, provides for a reference signal that can be compared individually with the output signal at each key position.

The sensing circuit may be replaced by a common reference inductance so as to produce a reference signal across this common reference inductance but in the preferred embodiment of the invention the actual reference circuit includes the excitation reference pattern 100 and the sensing reference pattern 102 so as to be substantially similar to the excitation and sensing patterns 28 and 26. The use of reference patterns 100 and 102 ensures that any environmental changes which would affect the patterns 28 and 26 would also similarly affect the patterns 100 and 102. Also, any change in the excitation voltage pulses 106 would create similar changes in all of the excitation patterns including the excitation reference pattern 102. Additionally, any variations in the output pulses 112 due to the number of key stations in a row and the number of keys depressed in a row will affect the reference pulse 116 in a similar manner. The reference pulses 116 are therefore in a balanced relationship with the output pulses 112 and their ratio is an accurate measure of mutual inductance which in turn is an accurate measure of key depression.

The reference pulses 116 may actually have a lower amplitude then the maximum amplitude for the output pulses 112 since as shown in FIG. 2, the reference patterns 100 and 102 are smaller in size than the key patterns 28 and 26. The voltage comparator 114 produces an output which is high when any of the output pulses 112 are greater than the reference pulse 116. This high output from the comparator 114 represents the key 10 of FIG. 1(a) being in the up position or un-depressed condition. The voltage comparator 114 provides an output which is low when any of the output pulses 112 are less than the reference signal 116. This low output from the comparator 114 represents the key 10 FIG. 1(a) being depressed. The system of FIG. 2 therefore provides for the detection of the depression of any of the individual keys and with this depression sensed and compared to a signal from the reference circuit and with an output signal having a low amplitude in accordance with the depression of any individual key.

FIG. 3 illustrates an expanded version of the system of FIG. 2 and further includes a structure for sensing partial and full key depressions. Such sensing of partial and full key depressions may be used to eliminate false key repeats caused, for example, by key bounce. Specifically the detection of full and partial key depression may be used to provide key height hysteresis.

In FIG. 3 the printed circuit board 24 and the excitation and sensing patterns 28 and 26 are shown schemetically but would have a similar structure to that shown in FIGS. 1 and 2. In addition the reference circuit formed on the board 24′ includes two excitation reference patterns 100 and two sensing reference patterns 102. The two excitation reference patterns 100 are coupled in series with the individual rows of excitation patterns 28 in a similar manner to that described with reference to FIG. 2. The sensing reference patterns 102 are arranged to produce a pair of reference pulses 136 and 140 and with one pulse 136 having a larger amplitude than the other pulse 140. These two reference pulses 136 and 140 are used to provide for a detection of both partial and full key depression for the individual keys. The use of the detection of full and partial key depression to eliminate false key repeats may be referred to as key height hysteresis. The false key repeats can occur if the key is not completely depressed or not completely retracted after being depressed if only one reference pulse is used.

In the system of FIG. 3, a one shot 120 is used to produce a square wave to control the operation of the system. Specifically the one shot is applied to a decoder 122 as an enable input and is also applied to control the operation of a pair of flip-flops 124 and 126. The decoder 122 controls the operation of one of a plurality of transistors 128, 130 and 132 in accordance with an address as provided by a binary input to the input terminals of the decoder marked A, B and C. In particular, the binary input addresses sequential ones of the transistors 128, 130 and 132 to conduct current, and with the length of time each transistor conducts controlled by the width of the pulses from the one shot 120. The rows of excitation patterns 28 are therefore sequentially excited by a square wave signal formed by pulses 106 in accordance with the operation of the decoder 122.

The columns of sensing patterns 26 are scanned sequentially under the control of an analog multiplexer 134 so as to determine the depression of an individual key. The sequential scanning of each column is controlled by a binary input address signal at terminals X, Y and Z. The position of the key at each key station is therefore determined in accordance with the sequential excitation of the rows at patterns 28 and the sequential sensing of the columns of pattern 26. Both the decoder 122 and the multiplexer 134 may have their binary input adress signals provided by a microprocessor 142.

The output pulses 112 representing the sensing at the various individual key stations may have a varying amplitude as shown in accordance with the amount of depression of an individual key. In order to determine that there has been a proper depression of a key followed by a substantial return of the key to its original position, the varying amplitude of the output pulses 112 may be used in combination with the different amplitude reference pulses 136 and 140 produced by the reference sensing patterns 102.

In particular, the first amplitude reference pulse 136 is applied to a first voltage comparator 138. A second amplitude reference pulse 140 is applied to a voltage comparator 142. The output pulses 112 are applied to both voltage comparators 138 and 142. The output pulse 112 from a particular key station is normally higher than both reference pulses 136 and 140 if the key is not depressed. When the key is fully depressed the output pulse 112 is lower than both reference pulses 136 and 140. During the depression of the key, from the undepressed to the fully depressed condition, the output pulse 112 will have an amplitude lower than the reference pulse 136 but higher than the reference pulse 140. The two voltage comparators 138 and 142 may thereby provide for output signals representative of full and partial key depression as well as no depression.

The output signals from the voltage comparators 138 and 142 are used as inputs to the flip-flops 124 and 126. It will be appreciated in that if signals are produced representative of partial and full key depression as well as no depression the signals may be used to eliminate false key signals. For example, if the key is only partially depressed this may not by itself be sufficient to represent the actual desired full depression of the key. The actual full depression of the key would have the partial depression signal followed by the full depression signal. In a similar manner, if the key is depressed fully and then let up and depressed again such as can occur if there is a bounce, this would not represent the desired depression of the key twice. This can be determined since the full depression signal would not be preceeded by the no depression signal. The proper key depression for each key depression may therefore be considered to include first no depression followed by the partial depression signal, followed by the full depression signal. Such a sequence would completely eliminate false key repeats. This detection of both full and partial depression is referred to as key height hysteresis capability. The outputs from the flip flops 124 and 126 are applied to the microprocessor 142. The microprocessor 142 provides the interpretation of the key height hysteresis and may also implement N-Key Rollover.

FIGS. 4, 5 and 6 illustrate alternative structures for producing the reference pulses at the two different amplitudes. In FIG. 4, the board 24' includes the excitation and sensing reference patterns 100 and 102 of the same size as the key patterns 28 and 26 and with the output of the sensing reference pattern 102 provided across a voltage divider network 150. The voltage divider network 150 is shown to provide for reference pulses 136 and 140 at two different amplitudes but it is to be appreciated that additional amplitude pulse signals may be produced if desired.

FIG. 5 illustrates the board 24' including the excitation reference pattern 100 and the sensing reference pattern 102 being of the smaller size and with the sensing reference pattern 102 tapped at a middle position so as to again produce reference pulses 136 and 140 at two different amplitudes.

FIG. 6 illustrates the board 24' including two smaller excitation reference patterns 100 and two smaller size sensing reference patterns 102 similar to those shown in FIG. 3 except that the patterns are located in a different portion of the circuitry of FIG. 3. Specifically, the reference circuit may be positioned at the emitter side of the transistors 128, 130 and 132 as shown in FIG. 6. Reference pulses 136 and 140 at the two amplitudes are thereby produced.

The present invention therefore provides for a solid state non-contacting keyboard including non-electrical key assemblies and with no electrical connections of the key assemblies to the printed circuit board. All of the electronic components within each key scan area are simple etched inductors. Only one disk-like element is needed at each key station although more than one disk-like element may be used if desired. The invention includes low impedance circuit paths which minimize electrical static discharge susceptibility and electromagnetic interference susceptibility. The invention includes the use of reference signal to provide for a reliable sensing of a key depression by a comparison between an output pulse across a key sensing pattern and a reference pulse across a reference sensing pattern thereby providing a comparison of the modulated mutual inductance of the key patterns with the mutual inductance of the reference circuit independantly of the excitation current. In the preferred embodiment the reference pulse is produced using substantially identical excitation and sensing reference patterns to those used for the sensing of each key depression and with the excitation and sensing reference patterns arranged on a printed board in the same fashion as the excitation and sensing patterns for each key station. Additionally, the reference circuit may provide for reference pulses of more than one amplitude so as to determine both full and partial key depression so as to allow for a key height hysteresis capability and thereby eliminate false key repeats. The present invention is also adaptable to the use of N-Key Rollover techniques since the depression of each key can be determined independently of the depression of other keys.

Other advantages of the present invention are the ability to provide measurements in a short time so as to provide for high keyboard scan rates. In addition, the measurements of the individual key depressions may be accomplished with low power consumption, low cost and high reliability.

Although the invention has been described with reference to particular embodiments, it is to be appreciated that various adaptations and modifications may be made and the invention is only to be limited by the appended claims.

I claim:
1. A non contacting inductive keyboard, including,
a printed circuit board including printed circuit patterns forming a multiplicity of key excitation patterns and key sensing patterns and with the multiplicity of key excitation patterns divided into groups of key excitation patterns formed in rows and with each row having the patterns connected in series and with the multiplicity of key sensing patterns divided into groups of key sensing patterns formed in columns and with each column having the patterns connected in series and with each key excitation pattern having an adjacent complementary key sensing pattern for forming a key transformer having one primary and one secondary having a key mutual inductance therebetween for providing output signals from key sensing patterns in different columns in accordance with the pasage of an excitation signal through an individual row of key excitation patterns, a multiplicity of movable elements located adjacent the printed circuit board and with at least one element located adjacent each pair of complementary key excitation and sensing patterns and with the movement of each element between positions close to and away from each pair of complementary key patterns providing for a change in the key mutual inductance and thereby a change in the amplitude of the output signal from individual key sensing patterns, printed circuit reference patterns forming at least one excitation reference pattern and one sensing reference pattern to form a reference transformer having a fixed reference mutual inductance having a value intermediate the values of the key mutual inductance with the movable element close to and away from each pair of complementary key patterns, and with the excitation reference pattern coupled to the multiplicity of key excitation patterns to have the excitation signal pass through the excitation reference pattern in accordance with the passage of the excitation signal through any of the individual rows of key excitation patterns for providing at least one reference signal from the sensing reference pattern having an intermediate amplitude in accordance with the reference mutual inductance, and means coupled to the output signals from the key sensing patterns and the reference signal from the sensing reference pattern for providing a comparison between the reference signal and the output signals.

2. The non contacting inductive keyboard of claim 1 wherein the multiplicity of key excitation patterns are formed on one side of the printed circuit board and the multiplicity of key sensing patterns are formed on the other side of the printed circuit board.

3. The non contacting inductive keyboard of claim 1 wherein the multiplicity of movable elements are constructed of conductive material.

4. The non contacting inductive keyboard of claim 1 wherein the multiplicity of movable elements are constructed of magnetically susceptible material.

5. The non contacting inductive keyboard of claim 1 wherein each movable element is normally away from each pair of complementary patterns.

6. The non contacting inductive keyboard of claim 1 wherein each movable element is normally close to each pair of complementary patterns.

7. The non contacting inductive keyboard of claim 1 wherein two linked movable elements are located adjacent each pair of complementary key patterns and with one of the two movable elements constructed of conductive material and the other of the two movable elements constructed of magnetically susceptible material and with one of the two movable elements normally away from each pair of complementary key patterns and with the other of the two movable elements normally close to each pair of complementary key patterns.

8. The non contacting inductive keyboard of claim 1 wherein the multiplicity of key excitation patterns are formed on one side of the printed circuit board and the multiplicity of key sensing patterns are formed on the other side of the printed circuit board and wherein the multiplicity of movable elements are constructed of conductive material and are located adjacent the other side of the printed circuit board and are normally away from the pairs of complementary key patterns.

9. The non contacting inductive keyboard of claim 1 wherein the reference patterns are smaller than the key excitation and sensing patterns to produce the intermediate amplitude for the reference signal.

10. The non contacting inductive keyboard of claim 1 wherein two reference signals are provided from the reference patterns and with the two reference signals having two different amplitudes for comparing with the amplitudes of each of the output signals.

11. The non contacting inductive keyboard of claim 10 wherein the reference patterns include at least two excitation reference patterns and two sensing reference patterns for providing the two reference signals.

12. The non contacting inductive keyboard of claim 10 wherein the sensing reference pattern is tapped for providing the two reference signals.

13. The non contacting inductive keyboard of claim 10 additionally including a divider network coupled to the sensing reference patterns for providing the two reference signals.

14. The non contacting inductive keyboard of claim 1 wherein the multiplicity of key excitation patterns and sensing patterns and the reference patterns are all formed on the same printed circuit board.

15. An inductive keyboard, including, a multiplicity of printed circuit patterns forming key excitation patterns and key sensing patterns and with the excitation patterns formed in rows and with the patterns in each row connected in series and with the key sensing patterns formed in columns and with the patterns in each column connected in series and with each key excitation pattern having an adjacent complementary key sensing pattern for forming a key transformer having one primary and one secondary having a key mutual inductance therebetween, means sequentially coupled to the rows of key excitation patterns for providing for the passage of an excitation signal through the individual rows of key excitation patterns in sequence for producing output signals across key sensing patterns in the different columns, means sequentially coupled to the columns of key sensing patterns for detecting the output signals across the individual columns of key sensing patterns in sequence, a multiplicity of movable elements located adjacent the multiplicity of printed circuit patterns and with at least one element located adjacent each pair of complementary key excitation and sensing patterns and with the amplitude of the output signals varied in accordance with the change in key mutual inductance provided by the movement of each element between positions close to and away from each pair of complementary key patterns, a reference circuit coupled to the multiplicity of key excitation patterns to have the excitation signal pass through the reference circuit in accordance with the passage of the excitation signal through any of the individual rows of key excitation patterns for providing at least one reference signal from the reference circuit having an amplitude intermediate the amplitude of the output signals with the movable element close to and away from each pair of complementary key patterns, and means coupled to the output signals produced across the key sensing patterns and the reference signal from the reference circuit for providing a comparison between the reference signal and the output signal.

16. The inductive keyboard of claim 15 wherein the key excitation patterns are formed on one side of a printed circuit board and the key sensing patterns are formed on the other side of the printed circuit board.

17. The inductive keyboard of claim 15 wherein the multiplicity of movable elements are constructed of conductive material.

18. The inductive keyboard of claim 15 wherein the multiplicity of movable elements are constructed of magnetically susceptible material.

19. The inductive keyboard of claim 15 wherein each movable element is normally located away from each pair of complementary key patterns.

20. The inductive keyboard of claim 15 wherein each movable element is normally close to each pair of complementary key patterns.

21. The inductive keyboard of claim 15 wherein two linked movable elements are located adjacent each pair of complementary key patterns and with one of the two movable elements constructed of conductive material and the other of the two movable elements constructed of magnetically susceptible material and with one of the two movable elements normally away from each pair of complementary key patterns and with the other of the two movable elements normally close to each pair of complementary key patterns.

22. The inductive keyboard of claim 15 wherein the key excitation patterns are formed on one side of a printed circuit board and the key sensing patterns are formed on the other side of the printed circuit board and wherein the mutiplicity of movable elements are constructed of conductive material and are located adjacent the other side of the printed circuit board and are normally away from the pairs of complementary key patterns.

23. The inductive keyboard of claim 1 wherein the reference signal is produced by printed circuit excitation and sensing reference patterns and wherein the reference patterns are smaller than the key excitation and sensing patterns to produce the intermediate amplitude for the reference signal.

24. The inductive keyboard of claim 15 wherein a plurality of reference signals are provided from the reference circuit and with the plurality of reference signals having a plurality of different amplitudes for comparing with the amplitudes of each of the output signals.

25. The inductive keyboard of claim 15 wherein the reference signals are produced by printed circuit excitation and sensing reference and include at least two excitation reference patterns and two sensing reference patterns for providing the two reference signals.

26. The inductive keyboard of claim 24 wherein the reference circuit is tapped for providing the two reference signals.

27. The inductive keyboard of claim 24 additionally including a divider network coupled to the reference circuit for providing the two reference signals.

28. The inductive keyboard of claim 15 wherein the multiplicity of key excitation patterns and sensing patterns are all formed on the same printed circuit board and wherein the reference signal is produced by printed circuit excitation and sensing reference patterns formed on the same printed circuit board.

* * * * *